US009469487B2

(12) United States Patent
Wang et al.

(10) Patent No.: US 9,469,487 B2
(45) Date of Patent: Oct. 18, 2016

(54) CONVEYANCE DEVICE

(71) Applicant: IHI Corporation, Tokyo (JP)

(72) Inventors: Peng Wang, Tokyo (JP); Kengo Matsuo, Tokyo (JP); Yoshiyuki Wada, Tokyo (JP)

(73) Assignee: IHI Corporation, Tokyo (JP)

( * ) Notice: Subject to any disclaimer, the term of this patent is extended or adjusted under 35 U.S.C. 154(b) by 0 days.

(21) Appl. No.: 14/706,456

(22) Filed: May 7, 2015

(65) Prior Publication Data

US 2015/0239682 A1 Aug. 27, 2015

Related U.S. Application Data

(63) Continuation of application No. PCT/JP2013/054951, filed on Feb. 26, 2013.

(51) Int. Cl.
  *B65G 47/92* (2006.01)
  *B65G 49/06* (2006.01)
  *H01L 21/677* (2006.01)
  *B65G 51/03* (2006.01)
  *G02F 1/13* (2006.01)

(52) U.S. Cl.
  CPC .......... *B65G 49/065* (2013.01); *B65G 51/03* (2013.01); *G02F 1/1303* (2013.01); *H01L 21/67784* (2013.01); *B65G 2249/045* (2013.01)

(58) Field of Classification Search
  CPC .................................................. B65G 49/065
  USPC ....................................... 198/689.1; 414/676
  See application file for complete search history.

(56) References Cited

U.S. PATENT DOCUMENTS 3,545,813 A * 12/1970 Matsumoto ............ B65G 51/03
                                                            104/138.1
4,804,081 A *  2/1989 Lenhardt ............ B65G 21/2036
                                                             198/689.1

(Continued)

FOREIGN PATENT DOCUMENTS

JP     2001-233452 A     8/2001
JP     2004-244186 A     9/2004

(Continued)

OTHER PUBLICATIONS

International Search Report mailed May 21, 2013 in PCT/JP2013/054951 (with English translation) (4 pages).

(Continued)

*Primary Examiner* — William R Harp
(74) *Attorney, Agent, or Firm* — Rothwell, Figg, Ernst & Manbeck, P.C.

(57) ABSTRACT

A conveyance device for levitating a subject body by a gas and conveying the subject body in a first direction is comprised of a levitation section emitting the gas to apply pressure on the subject body to levitate the subject body; a conveyance section comprising an endless belt elongated in the first direction and a plurality of projections projecting from the belt and capable of coming in contact with the subject body, and being configured to come in contact with and drive the subject body in the first direction; and a suction section elongated adjacent to and in parallel with the conveyance section or aligned with the conveyance section in a single straight line, the suction section applying negative pressure on the subject body to have the subject body in contact with the conveyance section.

7 Claims, 10 Drawing Sheets

(56) References Cited

U.S. PATENT DOCUMENTS

| | | | | |
|---|---|---|---|---|
| 6,481,565 | B1* | 11/2002 | Sherwood | B65G 21/2036 198/689.1 |
| 7,004,309 | B2* | 2/2006 | Sherwood | B65G 15/58 198/689.1 |
| 7,690,870 | B2* | 4/2010 | Lisec | B65G 49/063 406/86 |

FOREIGN PATENT DOCUMENTS

| JP | 2005-119818 A | 5/2005 |
|---|---|---|
| JP | 2005-154040 A | 6/2005 |
| JP | 2006-49493 A | 2/2006 |
| JP | 2008-66661 A | 3/2008 |
| JP | 2008-260591 A | 10/2008 |
| JP | 4349101 B2 | 10/2009 |
| JP | 2010-116220 A | 5/2010 |
| JP | 2011-29225 A | 2/2011 |
| JP | 2011-210985 A | 10/2011 |
| TW | 200410888 A | 7/2004 |
| WO | 2007/088614 A1 | 8/2007 |
| WO | 2007/088936 A1 | 8/2007 |
| WO | 2008/044706 A1 | 4/2008 |

OTHER PUBLICATIONS

The First Office Action mailed Nov. 30, 2015 in corresponding Chinese Patent Application No. 201380063583.6 (with an English translation) (14 pages).

Office Action mailed Oct. 20, 2015 in corresponding Japanese Patent Application No. 2011-265548 (with an English translation) (7 pages).

* cited by examiner

CONVEYANCE DEVICE

CROSS-REFERENCE TO RELATED APPLICATIONS

This application is a Continuation Application of PCT International Application No. PCT/JP2013/054951 (filed Feb. 26, 2013), the entire contents of which are incorporated herein by reference.

BACKGROUND OF THE INVENTION

1. Field of the Invention

The present invention relates to a conveyance device that conveys a thin substrate such as glass.

2. Description of the Related Art

Production of flat panel displays as typified by liquid crystal displays frequently uses a conveyance device for levitating and conveying a thin substrate such as thin glass in order to conveying the substrate without scratching it. Such a conveyance device is usually comprised of a levitation device that emits compressed air and further a belt conveyor or a roller conveyor that comes in contact with the levitated substrate and gives it a driving force.

Dusts adhering to the substrate or scratches thereon considerably affect the quality of the displays. One of causes for dust adhesion or making scratches on the surface is that the glass substrate gets in contact with the conveyance device or such. On the other hand, as the glass substrate is 0.7 mm or less in thickness and is therefore flexible, it is emphasized to convey the substrate with keeping its flatness for the purpose of preventing collision in the course of conveyance. There is a growing need for use of thinner glass in these days and thus conveyance thereof with keeping its flatness becomes more and more difficult.

Japanese Patent Applications Laid-open No. 2008-066661 and 2008-260591 disclose related arts. The former discloses an art of a conveyance device comprising a belt conveyor. According to this art, the belt is comprised of projections arranged at even intervals and the projections come in contact with a glass substrate to convey it.

The latter discloses an art of a conveyance device comprising a roller conveyor. According to the art of the PTL 2, an event where deformation of a glass substrate in which a pass line central portion of the glass substrate considerably floats upward or falls downward becomes prominent. To solve this problem, the air feeding rate from an air table unit at the lateral central position is regulated to suppress deformation of the glass substrate.

SUMMARY OF THE INVENTION

The aforementioned arts enable glass substrates to keep flatness in general. However, still there may be a technical problem in regard to local flexures such as a flexure at a foremost end relative to a conveyance direction. More specifically, when a glass substrate moves from a roller to a next roller, or from a conveyance device to a next conveyance device, as nothing supports its foremost end, the end at issue yields downward to its own weight. There must be a problem that the foremost end is likely to collide with the roller or the conveyance device.

The present invention has been achieved in light of the aforementioned problem. The present inventors has found out that, contrary to the general knowledge as described above, when a central part of a glass substrate is slightly deformed, a flexure at its foremost end will be suppressed, and has then reached the present invention.

According to an aspect of the present invention, a conveyance device for levitating a subject body by a gas and conveying the subject body in a first direction is comprised of a levitation section emitting the gas to apply pressure on the subject body to levitate the subject body; a conveyance section comprising an endless belt elongated in the first direction and a plurality of projections projecting from the belt and capable of coming in contact with the subject body, and being configured to come in contact with and drive the subject body in the first direction; and a suction section elongated adjacent to and in parallel with the conveyance section or aligned with the conveyance section in a single straight line, the suction section applying negative pressure on the subject body to have the subject body in contact with the conveyance section.

DETAILED DESCRIPTION OF THE EXEMPLARY EMBODIMENTS

Exemplary embodiments of the present invention will be described hereinafter with reference to the appended drawings.

Conveyance devices according to the embodiments of the present invention are preferably used to convey thin subject bodies such as glass plates in clean rooms for example. In cases of using glass plates, the subject bodies could be not only those of 0.7 mm in thickness but also those of from 0.1 mm to 0.3 mm in thickness.

Figure 1:
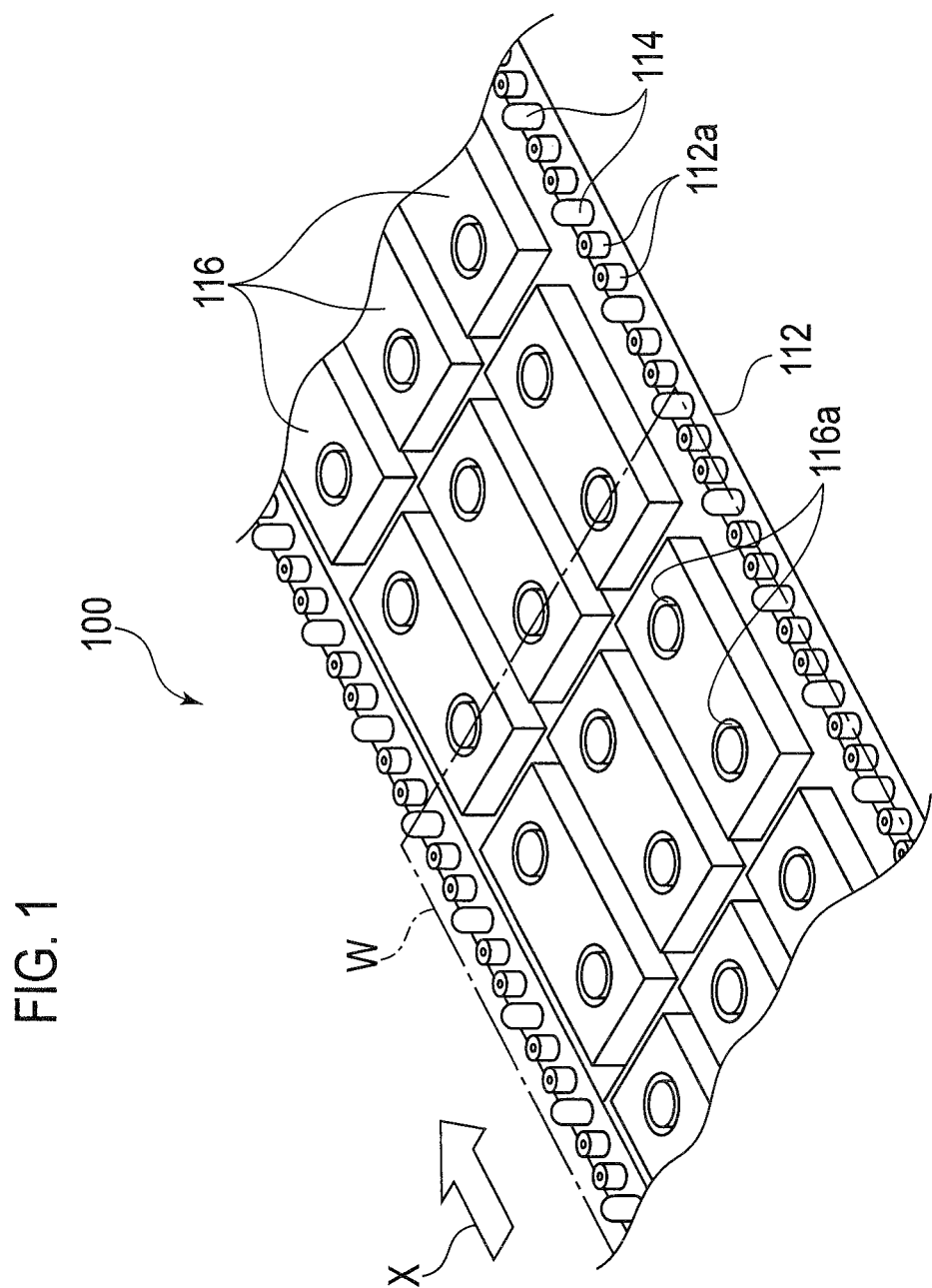
FIG. 1 is a perspective view showing a conveyance device according to an embodiment of the present invention.

Referring to FIG. 1, a conveyance device 100 according to an embodiment of the present invention is comprised of levitation sections 116 for levitating a workpiece W (as the subject body), conveyance sections 112 for driving the workpiece W in a direction X (as a first direction), and suction sections 112a for forcing the workpiece W to come in contact with the conveyance sections 112. Each conveyance section 112 is comprised of a plurality of projections 114. Each levitation section 116 is comprised of openings 116a for emitting a gas and the emitted gas applies positive pressure on the workpiece, thereby levitating the workpiece W. The suction sections 112a conversely applies negative pressure on and thereby suck the workpiece W, thereby forcing the workpiece W to come in contact with tips of the projections. As the conveyance sections 112 move in the direction of the arrow X by any means such as a motor, the workpiece W follows this and is thereby conveyed in the direction X. The workpiece W may be conveyed only by the conveyance sections 112, without the levitation sections 116.

Figure 2A:
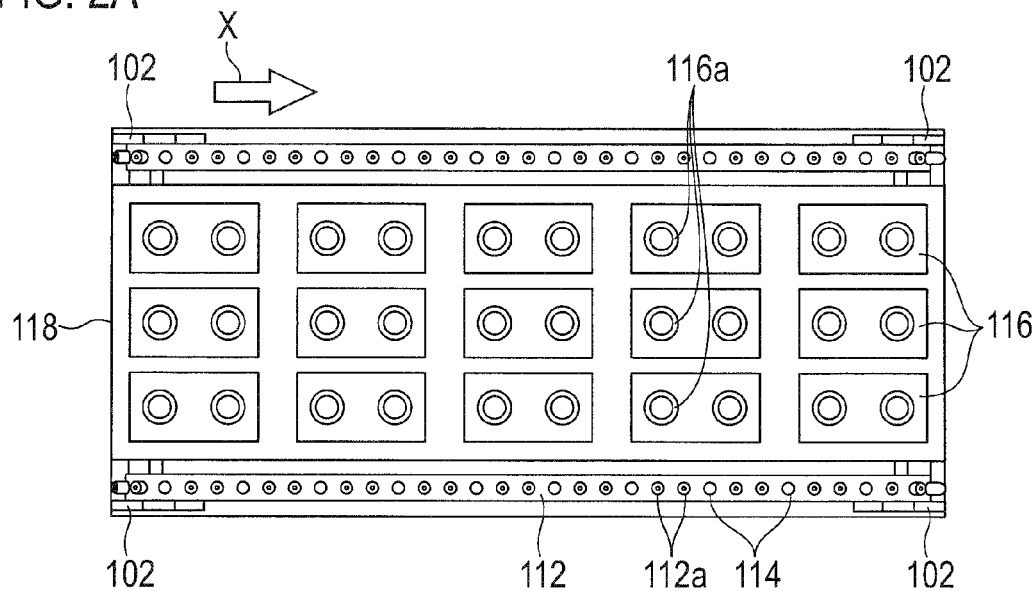
FIGS. 2A-2C are a plan view, an elevational view and a side view of the conveyance device of the embodiment, respectively.
Figure 2B:
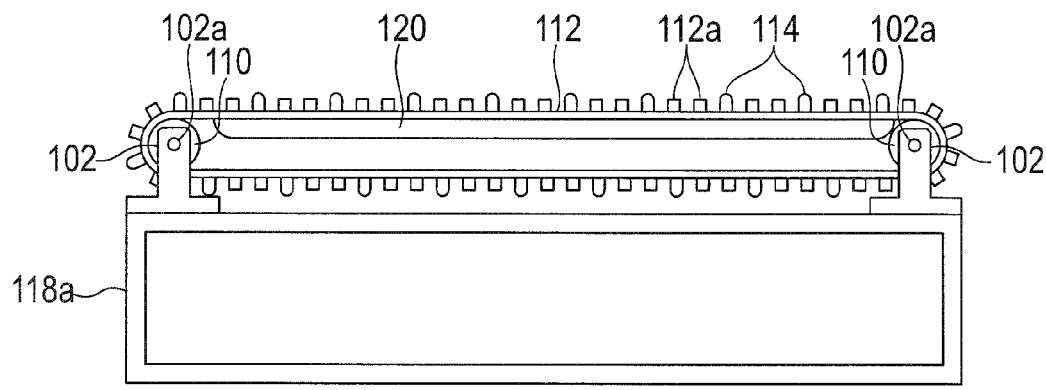
Figure 2C:
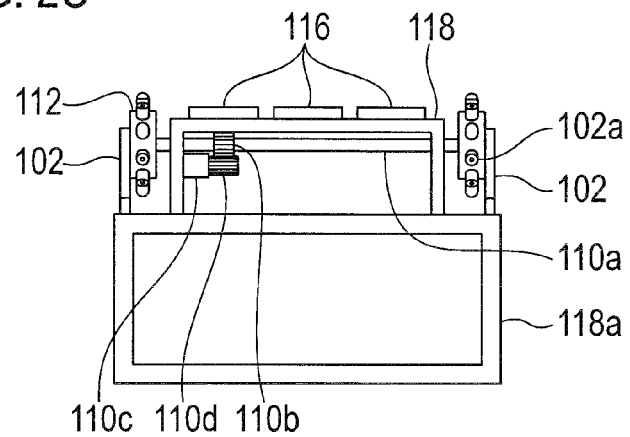

More detailed descriptions will be given hereinafter with reference to FIGS. 2A-2C. Both the conveyance sections 112 and the levitation sections 116 are supported by a supporting stand 118, which is installed on a floor or a grating of a clean room with having supporting legs 118a interposed therebetween. The levitation sections 116 are arranged on the supporting stand 118. A plurality of levitation sections 116 form a row along the direction X and another plurality of levitation sections 116 also form a row along a direction perpendicular to the direction X (the lateral direction). The number of rows may be arbitrarily selected and therefore the construction of the device can be arbitrarily modified depending on the dimensions of the subject body. The conveyance sections 112 are disposed at laterally both sides of the plurality of levitation sections 116 but any different arrangement is possible.

Figure 3:
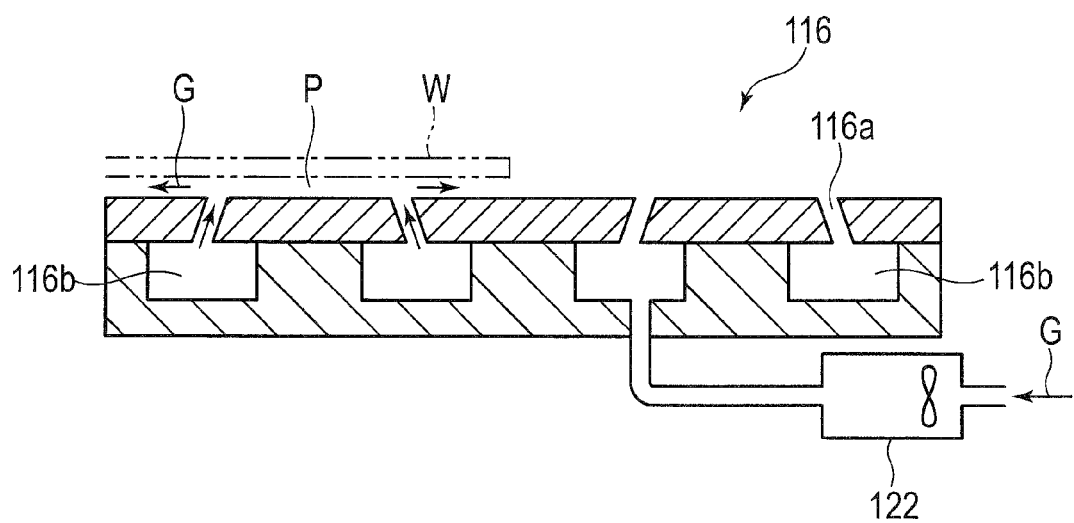
FIG. 3 is an elevational sectional view of a levitation section according to the embodiment.

Referring to FIG. 3, each levitation section 116 is as a whole formed in a box shape and its top face is generally flat. Inside the levitation sections 116 formed are hollows 116b in fluid communication with each other, and further the hollows 116b are in fluid communication with an exterior gas supplier 122. The gas supplier 122 is a pump or a compressor that pressurizes and supplies a gas G such as air or nitrogen to the levitation sections 116.

One levitation section 116 may connect with one gas supplier 122, or a plurality of levitation sections 116 may connect with a single gas supplier 122. Or, the gas supplier 122 may be directly in communication with the hollows 116b but any chamber for storing a certain amount of gas may be interposed therebetween.

In communication with the hollows 116b, openings 116a penetrate the top face of the levitation section 116 and open upward. Each opening 116a may be a circular slit as shown in FIGS. 1, 2 or may form various shapes such as a rectangular slit or plural slits, or a plurality of small pores. Or, the openings 116a may penetrate the top face vertically or may tilt relative to the top face. Or, the top face of the levitation section 116 may be partly or totally a mesh body or a porous body with aeration property.

The pressurized gas G supplied by the gas supplier 122 passes through the hollows 116b and spouts from the openings 116a. The spouting gas G generates a pressurized space P between the workpiece W and the levitation sections 116, thereby applying pressure on the workpiece W to give it levitation force. Then sources of the levitation force originated from not only force generated by collision of the spouting gas G with the workpiece G but also static pressure in the process where the spouting gas G, after the collision, scatters to the surroundings. Therefore relatively small pressure produces relatively large levitation force and it provides excellent energy efficiency.

Referring again to FIGS. 2A-2C, each conveyance section 112 is in general a belt conveyor comprising an endless belt going around two or more wheels 110. The wheels 110 are respectively supported by frames 102. The conveyance sections 112 are disposed at laterally both sides of the plurality of levitation sections 116, as described above, and are oriented so that the belts stretch along the direction X.

The wheels 110 are coupled with shafts 110a, which are in turn pivoted by pivot holes 102a of the frames 102, thereby the wheels 110 are capable of rotating thereabout. A gear 110b is coupled with the wheels 110, thereby unitarily rotating. To this coupling applicable is a combination of a key and a key hole, or instead of such fitting usable is a unitary structure.

The conveyance device 100 is further comprised of a driving device 110c such as an electric motor. The driving device 110c is comprised of a gear 110d meshing with the gear 110b, so that driving the driving device 110c results in rotation of the wheels 110, thereby the conveyance sections 112 go around the wheels 110. Alternatively the driving device may directly drive the wheels or any proper gears or pinion devices may be interposed therein.

Each conveyance section 112 is comprised of a plurality of projections 114 that project from the belt. The projections 114 are arranged to form a row along the direction X. The projections 114 may be formed as a unitary body with the belt or separate bodies engaging with the belt. The projections 114 are, as described later, formed to be slightly higher than the levitation height of the workpiece W. Its shape may be any of a cylinder, a parallelepiped, and a pyramid. Its tip may be flat, but alternatively may be either spherical or pyramidal in order to reduce the contact area. Still further, the tip may have a slope coming down to the levitation sections 116. More detailed descriptions about such embodiments will be given later.

The suction sections 112a are arranged to be aligned with the correspondent conveyance section 112 in a single straight line. This straight line is necessarily parallel with the direction X. More preferably the suction sections 112a are on the same straight line with the projections 114. Here the term "on the same straight line" does not necessarily mean that they are required to strictly form a single line but they may be deviated from the straight line as much as the deviations do not exceed a certain width. Where the width of the belt is 50 mm, a deviation of 20 mm or so from the center of the belt may fall within a permissible width.

Figure 4:
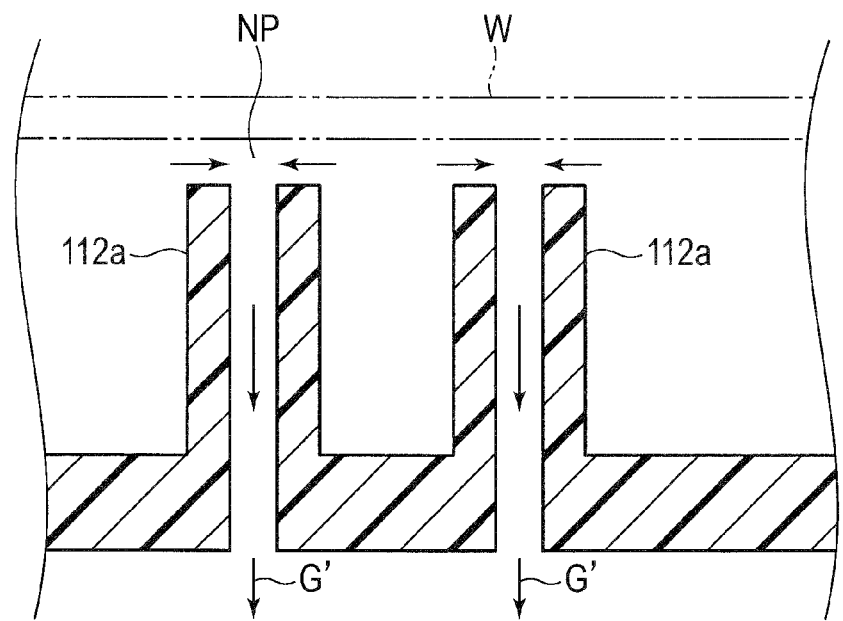
FIG. 4 is an elevational sectional view of a suction section according to the embodiment.

Referring to FIG. 4, the suction sections 112a are preferably formed in a unitary body with the belt and are respectively comprised of through-holes in spatially communication with a space under the belt. The suction sections 112a suck gas G' just below the workpiece W through these through-holes, thereby exerting negative pressure NP on the workpiece W. The gas G' may be the same as or different from the gas G as described above.

Figure 5A:
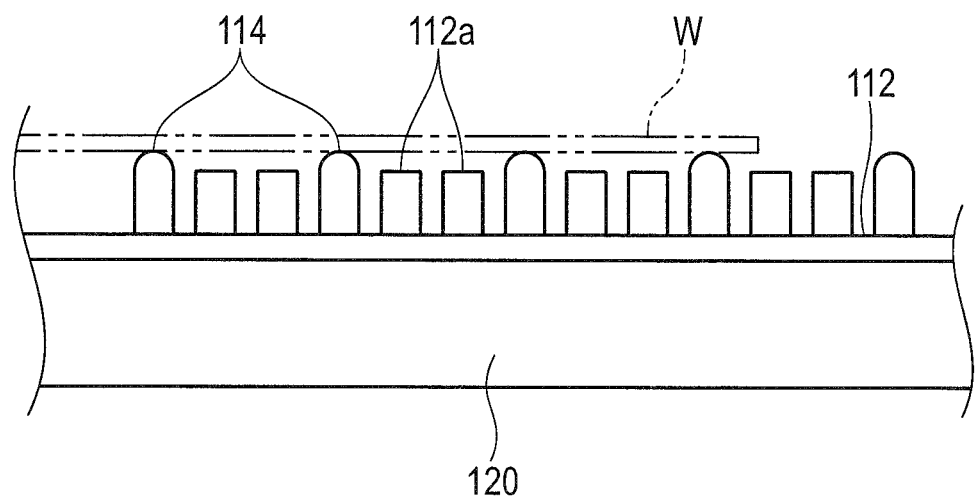
FIGS. 5A and 5B are an elevational view and a corresponding sectional view of the suction section and a conveyance section according to the embodiment.
Figure 5B:
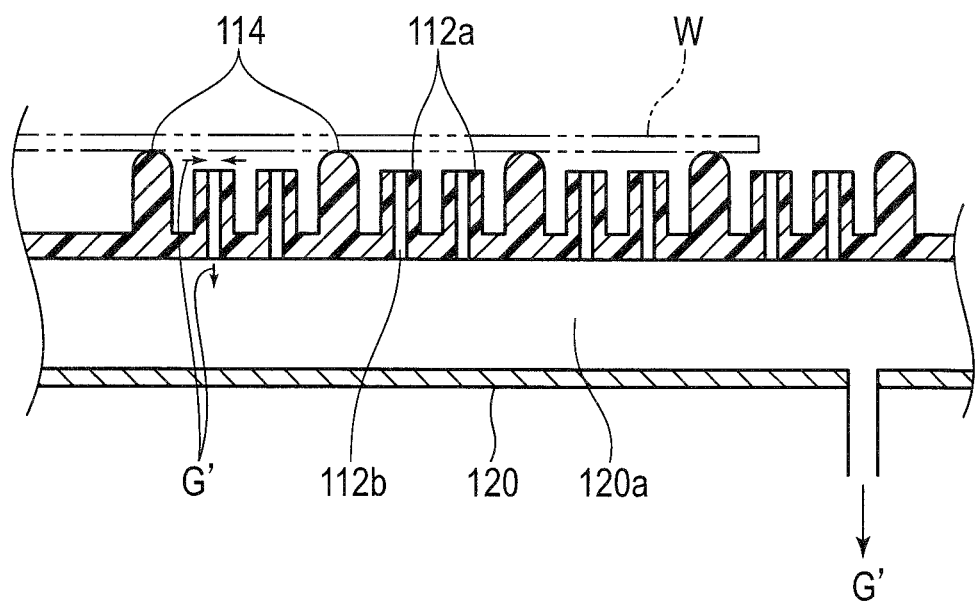

Referring to FIGS. 5A-5B in combination with FIG. 4, the suction sections 112a are formed to be slightly lower than the projections 114, thereby keeping a proper gap between the suction sections 112a and the workpiece W. Or, they may have the same height. In this case, when the suction sections 112a suck the gas G', the workpiece W is made to be in close contact with the suction sections 112a.

Below and in close contact with the suction sections 112a, a depressurized chamber 120 is provided. The depressurized chamber 120 is connected to a means for sucking the gas G', such as a pump or a compressor, and its internal space 120a is thereby depressurized. The through-holes 112b of the suction sections 112a are in communication with the space 120a so as to suck the gas G'. The suction sections 112a and the space 120a may be steadily in communication with each other but may be so structured that mutual communication is established only when the through-holes 112b pass through particular positions.

The suction sections 112a and the projections 114 are preferably arranged to alternate. The suction sections 112a and the projections 114 may be so arranged as to form a ratio of 2:1 as shown in the drawings but may form any arbitrary ratio such as 1:1 or 1:2.

Figure 6A:
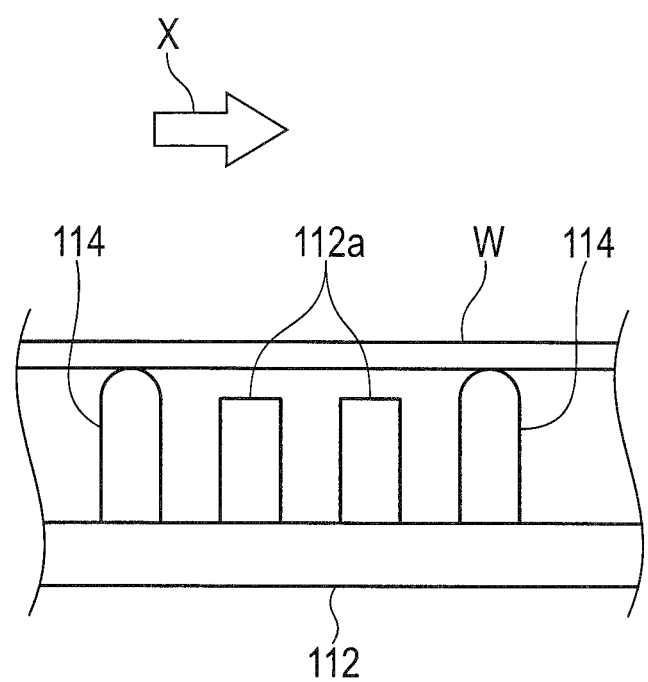
FIG. 6A is an elevational view showing a state in which a substrate is kept in flatness above the conveyance section.

According to the present embodiment, as shown in FIG. 6A, the suction sections 112a exert negative pressure on the workpiece W, thereby forcing the foremost end of the workpiece W to come in contact with the projections 114. As the projections 114 and the suction sections 112a are on the same straight line, the workpiece W is not made off-center and its flatness is therefore retained. The foremost end of the workpiece W keeps in contact with the projections 114 and moves ahead along with them, thereby being conveyed.

Figure 6B:
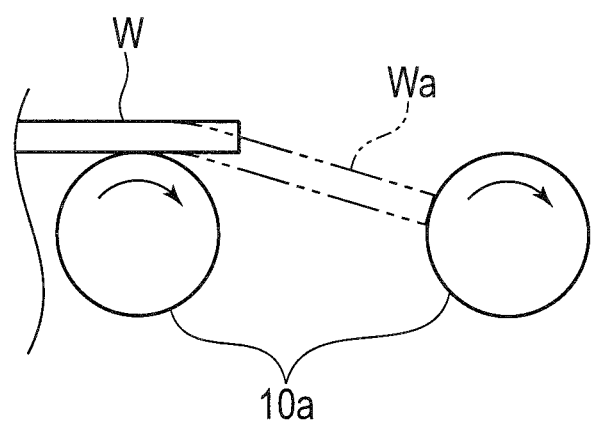
FIG. 6B is a schematic elevational view showing a state where a foremost end of a workpiece yields to its own weight.

A comparison with conveyance by rollers as shown in FIG. 6B will more clearly demonstrate the advantages of the present embodiment. In the conveyance by the rollers 10a, the rollers 10a do not move forward along with the workpiece W and therefore a foremost end portion Wa of the workpiece W will get yielding downward as the foremost end portion Wa hangs forward from one of the rollers 10a. Then the foremost end portion Wa is likely to collide with the adjacent roller 10a. By contrast, as will be understood from FIG. 6A, because the projections 114 move forward along with the workpiece W, the foremost end thereof, even if yielding downward, does not collide with any projection 114. As the workpiece W is rather supported by the plurality of projections 114 arranged in a line and then moves along therewith, the workpiece W is kept in a flat shape like as a ceiling supported by a plurality of pillars.

Figure 7:
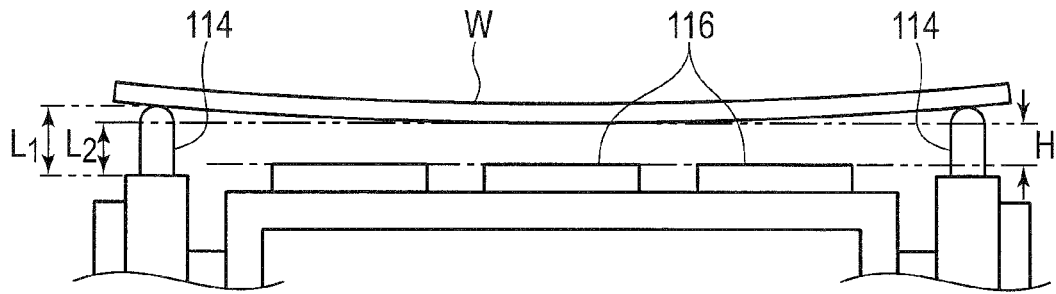
FIG. 7 is a side view showing a state in which the substrate is deformed around its center.

Referring to FIG. 7, both laterally side brims of the workpiece W are supported to be flat, and are made to have a constant height but the center and its vicinity of the workpiece W can slightly yield downward to its own weight. More specifically, the workpiece W may settle into a concave shape. Or, the device may have any deformation means for warping the center and its vicinity of the workpiece W.

One of such deformation means is a gas supplier that produces a particular levitation height H. By regulating pressuring force applied to the pressurized gas supplied by the gas supplier, the levitation height H above the levitation sections 116 can be mode lower than the height of the workpiece W on the projections 114. Alternatively, among the levitation sections 116, levitation force of particular levitation sections 116 closer to the center could be reduced. Still alternatively, in the gas supplier or the levitation sections 116, any proper pressure drop means or flow rate regulation means may be provided so as to reduce the levitation force. By such deformation means, it is possible to settle the workpiece W in the convex shape as shown in FIG. 7. Or, the workpiece W may be settled in a concave shape by increasing the levitation force by the levitation sections 116.

Another of the deformation means is to construct the projections 114 to warp the workpiece W. The workpiece W has a height H above the levitation sections 116 specifically determined by a relation between the weight of the workpiece W and the levitation force by the levitation sections 116. If the projections 114 are so formed as to have a height L1 higher than L2, where L2 is a height necessary for the projections 114 to support the workpiece W so as not to warp the workpiece W, the workpiece W can be made to settle in the convex shape as shown in FIG. 7.

Still another of the deformation means is a structure in that each tip of the projections 114 has a slope coming down to the levitation sections 112. The slopes of the projections 114 lead to urging the workpiece W at its center or the vicinity thereof to warp downward.

Various modifications would occur in the aforementioned embodiments. Some modified embodiments will be hereinafter described particularly in regard to the conveyance sections and the suction sections.

Figure 8A:
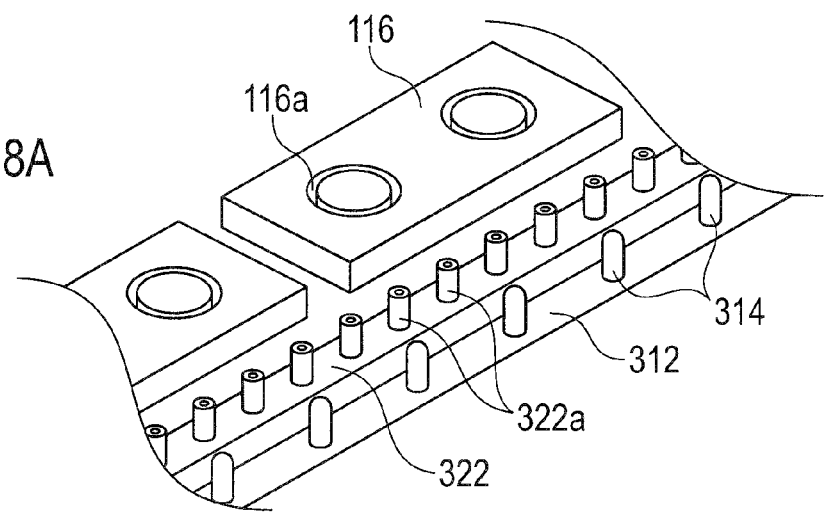
FIGS. 8A and 8B are a perspective view and a side view of a part of a conveyance device according to another embodiment.

FIG. 8A illustrates one of the modified embodiments, in which the conveyance sections 312 and the suction sections 322 are independently provided. Each suction section 322 stretches adjacent to and in parallel with the conveyance section 312 and each conveyance section 312 may be, as with the embodiments described above, comprised of a plurality of projections 314. Each suction section 322 is comprised of a plurality of projections 322a arranged in parallel with the conveyance section 312 and, through these openings, sucks gas. Preferably the projections 314 are formed to be slightly higher than the projections 322a of the suction sections 322. The suction sections 322 may be, without intervening depressurized chamber, directly connected with a means for sucking the gas G'.

Alternatively, in place of the projections 322a, a slit elongated in parallel with the conveyance section 312 or any other embodiment may be used.

Still alternatively, the suction sections may comprise a cover that encloses the belt and make the interior of the cover pressurized negatively. This is a kind of the embodiment in which the suction sections and the conveyance sections are arranged in a straight line. The whole of the conveyance sections is made to be negatively pressurized, so that brims of the workpiece W are unlikely to be deviated therefrom. It is advantageous in retaining flatness.

Figure 8B:
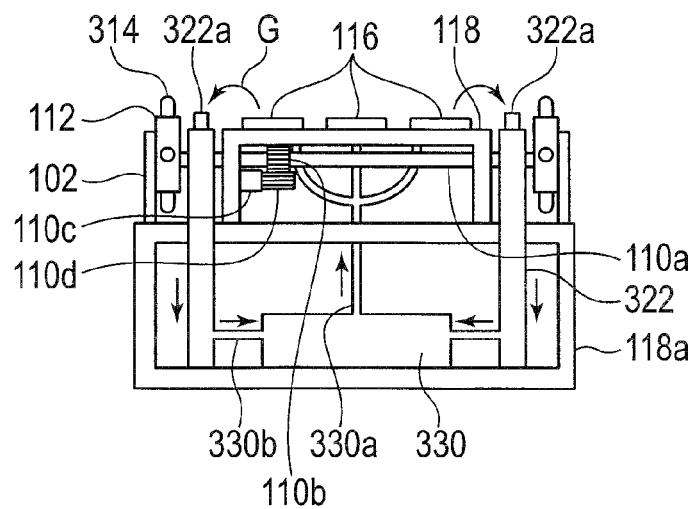

Further, as shown in FIG. 8B, flow paths 330b in communication with the suction sections 322 may be connected to a flow path 330a in communication with the levitation sections 116 so that the gas G is made to circulate. They constitute a circulation section. The means 330 such as the pump or the compressor can balance its inflow and outflow so as to improve energy efficiency, thereby it is advantageous in energy saving. Further in this case, the single means 330 functions as both a means for sucking the gas and a means for pressurizing the gas.

Figure 9A:
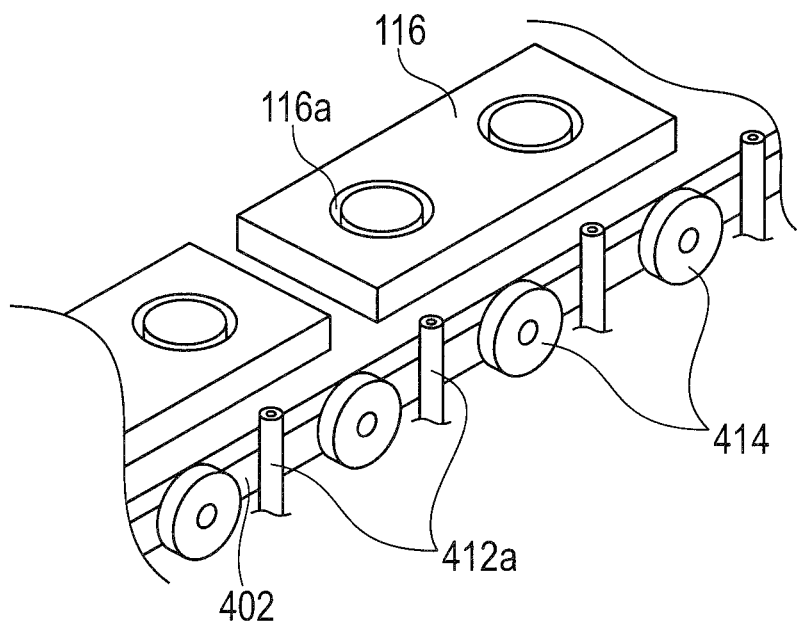
FIGS. 9A and 9B are a perspective view and a side view of a part of a conveyance device according to still another embodiment.
Figure 9B:
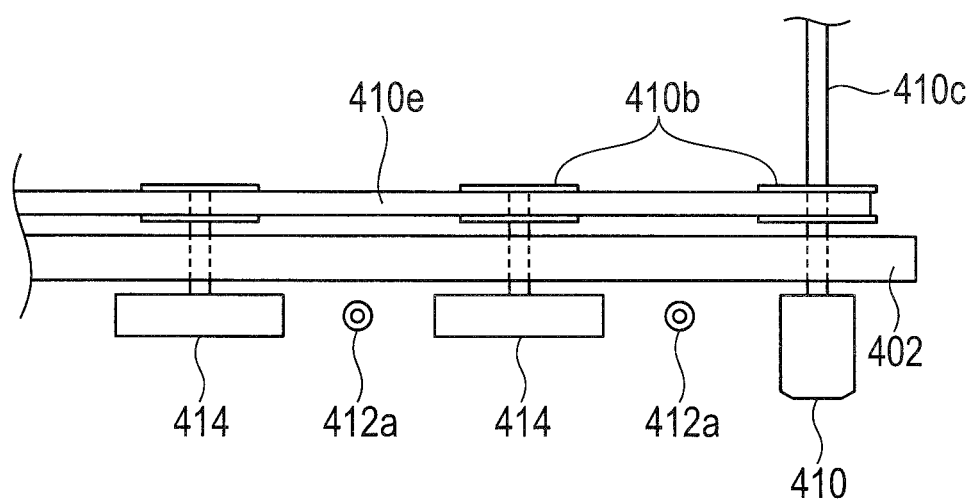

Alternatively, as shown in FIG. 9, the conveyance sections may be a roller conveyor. A plurality of rollers 414 is arranged along the direction X and is respectively rotatably supported by a frame 402. The suction sections 412a are aligned with the rollers 414 in a single straight line, and preferably they are arranged to alternate. Respective shafts of the rollers 414 are coupled with pulleys 410b and also a driving device such as an electric motor is coupled with the pulleys 410b. As these pulleys 410b are mutually connected via a belt 410e, all the rollers 414 synchronously rotate. A shaft 410c of the driving device 410 is preferably elongated to reach the opposite side, thereby rotating pulleys 410b at the opposite side. Thereby the rollers 414 at both sides synchronously rotate. Alternatively the driving device may be structured of, instead of the belts, a combination of shafts and gears. The suction sections 412a are, as with the embodiments described above, in communication with a suction means such as a pump or a compressor, thereby sucking brims of the workpiece W.

The aforementioned embodiment enables the device to support both laterally side brims of the workpiece W in a flat state and make the center and its vicinity of the workpiece W slightly warp.

Figure 10A:
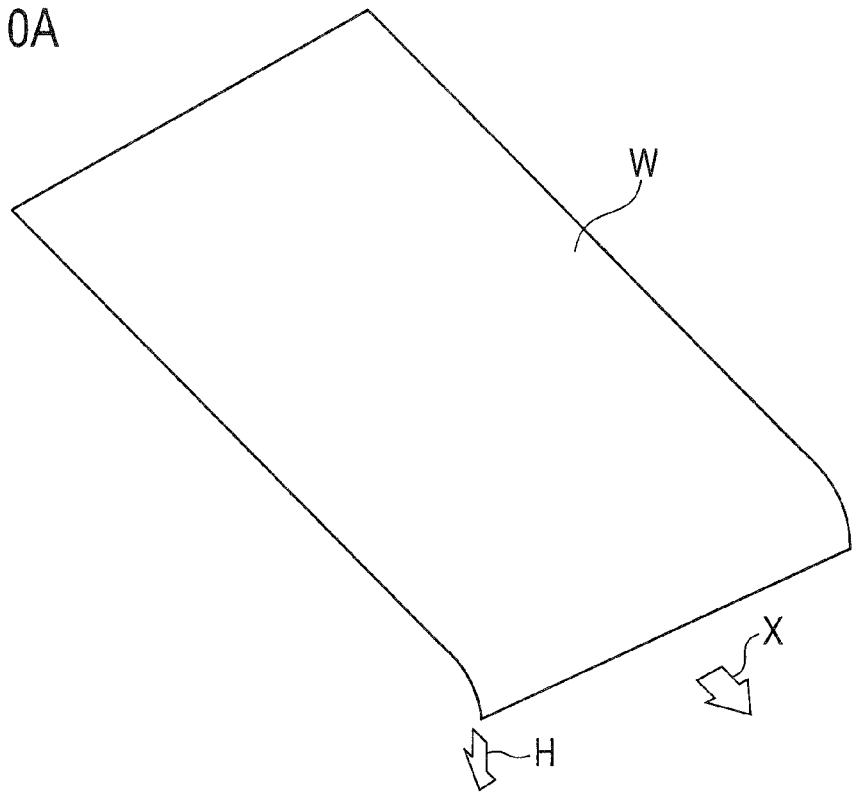
FIGS. 10A and 10B are perspective views of the substrate showing a state in which a substrate is kept to be flat in general but a foremost end thereof yields to its own weight (FIG. 10A), and another state in which the foremost end is prevented from yielding if its central part gets dented.
Figure 10B:
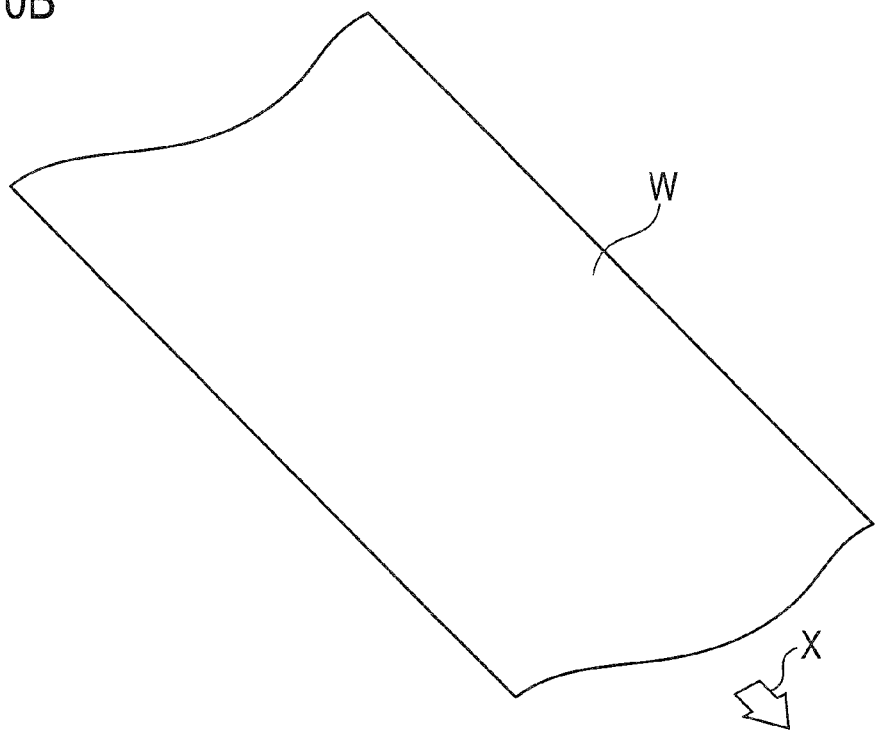

Effects produced by the aforementioned embodiments will be described hereinafter with reference to FIGS. 10A-10B. Referring to FIG. 10A, if one tried to keep the whole of the workpiece W in a flat shape according to the prior art, its own weight would force its foremost end portion to yield downward as illustrated by an arrow H when the foremost end was not supported. This event would occur when the workpiece W moved from one roller to the next roller, or from one conveyance device to the next conveyance device, for example. The workpiece W is likely to collide with the rollers or the conveyance devices as it yields downward. On the other hand, in accordance with the present embodiment, as shown in FIG. 10B, laterally side brims of the workpiece W are, along the conveyance direction X, kept in a flat shape and its center and its vicinity slightly warp. Then as the workpiece W as a whole forms a wave-like shape, the workpiece W cannot freely becomes deformed in the conveyance direction X and therefore its foremost end is, even if not supported, unlikely to yield downward. When the workpiece W moves from one roller to the next roller, or from one conveyance device to the next conveyance device, the foremost end of the workpiece W is prevented from colliding with the rollers or the conveyance devices.

The effects produced by the aforementioned embodiments were tested.

Figure 11A:
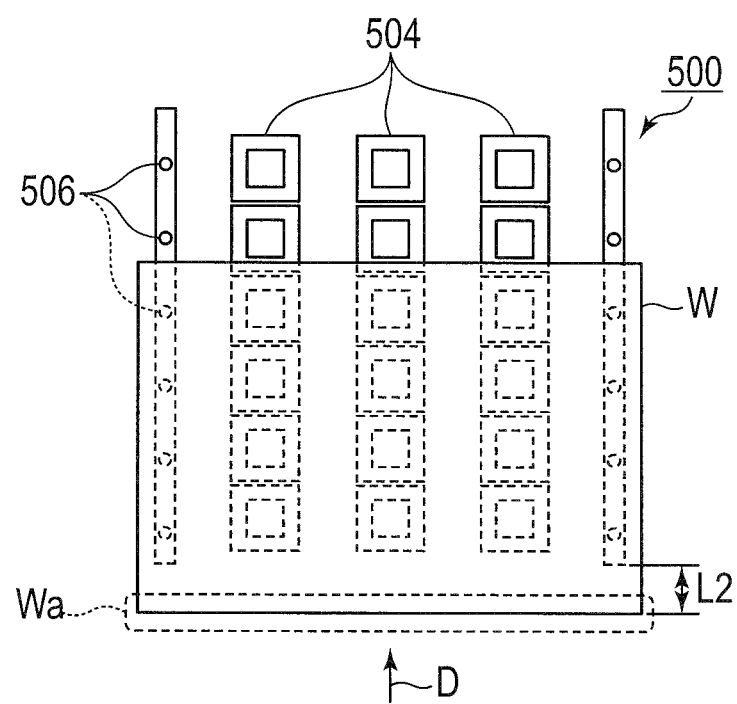
FIGS. 11A-11C are illustrative drawings for illustrating structures of test devices.
Figure 11B:
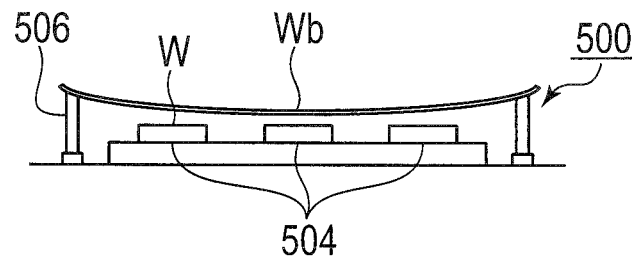
Figure 11C:
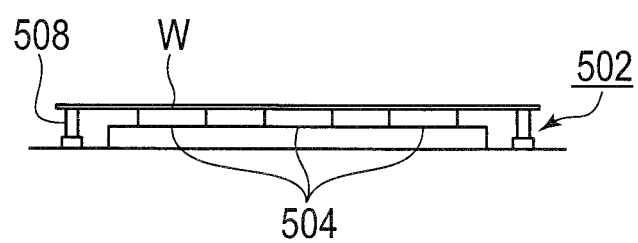

FIGS. 11A-11C are illustrative drawings for illustrating structures of test devices 500, 502. In particular, FIG. 11A shows a top view of the test device 500, FIG. 11B shows a side view of a D arrow view, and FIG. 11C shows a side view of the test device 502 corresponding to the D arrow view of FIG. 11B. Aluminum plates of 1300 mm×1000 mm×0.3 mm were here used as workpieces W.

As shown in FIGS. 11A and 11B, the test device 500 is constituted to contain levitation sections 504 and projection sections 506. The levitation sections 504 are constructed of ejection devices or such, which eject compressed air, like as the levitation sections 116, and generate a lower pressure below the workpiece W than a pressure by which the workpiece is kept to be horizontal. Therefore the workpiece W is supported by the projection sections 506 and as well its center portion Wb gets dented.

Further, as shown in FIG. 11C, the test device 502 is constituted to contain levitation sections 504 and projection sections 508. The projection sections 508 are lower in height than the projection sections 506, and the levitation sections 504 halt the function of generating pressure. Then the workpiece W is supported by the projection sections 508 and the levitation sections 504 in a flat state.

By either the test device 500 or 502, a lower foremost end portion Wa of the workpiece W in FIG. 11A is supported to project from the projection sections 506, 508 by the length L2. The length L2 was set to be 200 mm here.

Figure 12A:
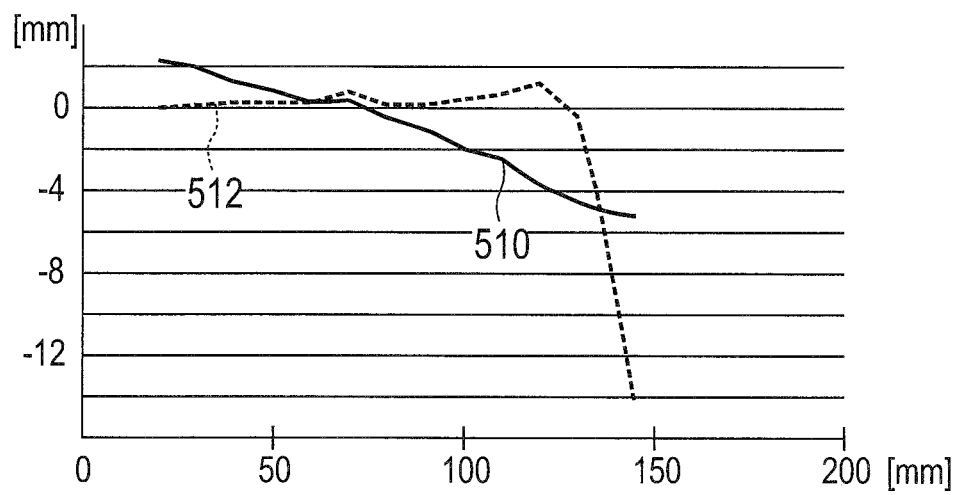
FIGS. 12A and 12B are graphs showing test results.
Figure 12B:
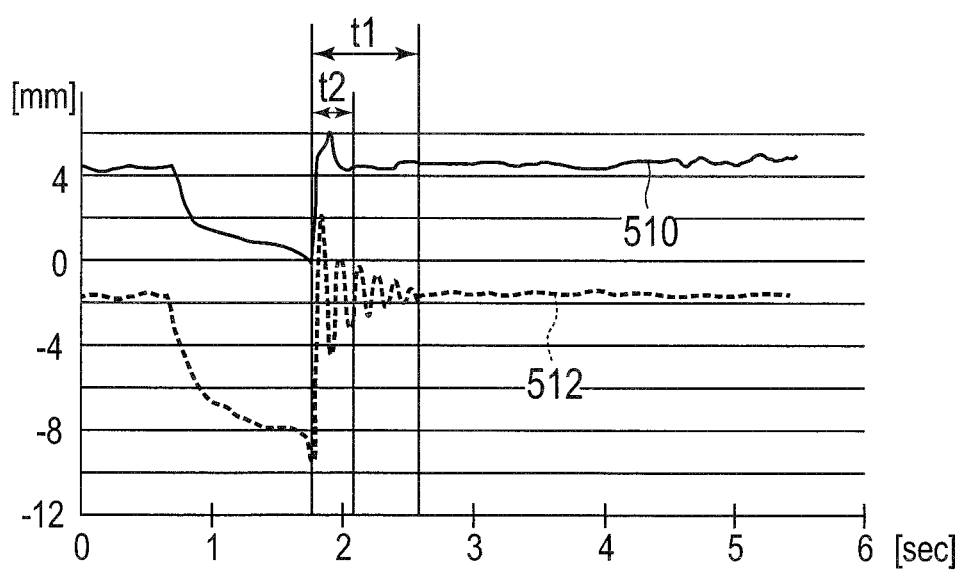

FIGS. 12A and 12B are graphs showing the test results. In particular, FIG. 12A shows a shape of the foremost end portion Wa of the workpiece W in the D arrow view of FIG. 11A, and FIG. 12B shows attenuation properties of the workpiece W when initial vibration was given. In FIG. 12A, the horizontal axis shows positions of the foremost end section Wa of the workpiece W projecting from the projection sections 506, 508 and the vertical axis shows heights at the projection positions of the foremost end sections Wa shown in the horizontal axis. In FIG. 12B, the horizontal axis shows times (sec) and the vertical axis shows heights of the measured points where the foremost end section Wa exists.

The solid line 510 here shows measured results when the center portion Wb of the workpiece W is supported to get dented vertically lower by the test device 500, and the broken line 512 shows measured results when the workpiece W is in a flat state made by the test device 502.

In a state where the workpiece W is kept in a flat state as shown in FIG. 12A, the foremost end portion Wa considerably hangs down. By contrast, in a state where the center portion Wb of the workpiece W gets dented vertically downward, the width of hanging down of the foremost end portion Wa was reduced by about one-third as compared with the state where the workpiece is in a flat state.

Times taken from when initial vibration is given and then maximum vibration occurs to when the vibration is settled will be next compared. As shown in FIG. 12B, the time t2 in a case where the center portion Wb of the workpiece W gets dented vertically downward is shortened by half or less than the time t1 in a case where the workpiece W is kept in a flat state.

As described above, in the test device 502, while the workpiece W gets in contact with the levitation sections 504, the fact that this contact between the workpiece W and the levitation sections 504 hardly affects rapidness of settlement of the vibration of the workpiece W is verified by other test experiments.

As being apparent from these tests, if the workpiece W is conveyed by any conveyance device of any embodiment of the present invention in a state where the center portion Wb of the workpiece W gets dented vertically downward, it becomes possible to suppress hanging-down of the foremost end portion Wa of the workpiece W and suppress vibration of the workpiece W, thereby enabling stable conveyance.

Although the invention has been described above by reference to certain embodiments of the invention, the invention is not limited to the embodiments described above. Modifications and variations of the embodiments described above will occur to those skilled in the art, in light of the above teachings.

INDUSTRIAL APPLICABILITY

A conveyance device that prevents deformation of foremost ends of substrates is provided.

What is claimed is:

1. A conveyance device for levitating a subject body by a gas and conveying the subject body in a first direction, comprising:
   a levitation section emitting the gas to apply pressure on the subject body to levitate the subject body;
   a conveyance section comprising an endless belt elongated in the first direction and a plurality of projections projecting from the belt and capable of coming in contact with the subject body, and being configured to come in contact with and drive the subject body in the first direction; and
   a suction section aligned with the conveyance section in a single straight line, the suction section applying negative pressure on the subject body to have the subject body in contact with the conveyance section and having an uppermost face lower than top faces of the projections to allow gas flow along the subject body.

2. The conveyance device of claim 1, wherein the suction section and the plurality of projections are arranged to alternate in the first direction.

3. The conveyance device according to claim 2, wherein at least one suction opening is positioned between adjacent projections of said plurality of projections.

4. The conveyance device of claim 1, wherein the levitation section or the conveyance section includes deformation means configured to warp the subject body at its lateral center.

5. The conveyance device of claim 4, wherein the deformation means is a gas supplier configured to cause the subject body to be positioned a levitation height at a location above the levitation section which is lower than a height of the subject body on the plurality of projections.

6. The conveyance device of claim 1, further comprising:
   a circulation section configured to circulate the gas sucked by the suction section to the levitation section.

7. The conveyance device of claim 1, wherein each of the plurality of projections has a slope extending downwardly toward the levitation section.

\* \* \* \* \*